United States Patent [19]
Mori

[11] Patent Number: 6,137,373
[45] Date of Patent: Oct. 24, 2000

[54] SYNCHRONOUS OSCILLATION CIRCUIT OPERABLE IN SELF-ADVANCING OSCILLATION DURING ABSENCE OF SYNCHRONIZING PULSES

[75] Inventor: Haruya Mori, Tenri, Japan

[73] Assignee: Sharp Kabushiki Kaisha, Osaka, Japan

[21] Appl. No.: 09/377,059

[22] Filed: Aug. 19, 1999

[30] Foreign Application Priority Data

Sep. 10, 1998 [JP] Japan .................................. 10-257229

[51] Int. Cl.$^7$ .............................................. H03K 3/0231
[52] U.S. Cl. .......................................... 331/145; 331/172
[58] Field of Search .................................. 331/111, 143, 331/145, 172, 173

[56] References Cited

U.S. PATENT DOCUMENTS

| | | | |
|---|---|---|---|
| 5,592,128 | 1/1997 | Hwang | 331/143 |
| 5,870,000 | 2/1999 | Matsuda et al. | 331/111 |
| 5,912,593 | 6/1999 | Susak et al. | 331/111 |

FOREIGN PATENT DOCUMENTS

2748385B2   2/1998   Japan .

Primary Examiner—Siegfried H. Grimm

[57] ABSTRACT

An oscillation output generating circuit outputs a voltage V0 as an oscillation output, and a first comparing circuit compares V0 with a constant voltage V1, while a second comparing circuit compares V0 with a constant voltage V2 (<V1). In response to outputs from the first and second comparing circuits, a state maintaining circuit controls the raising/dropping of V0 through the oscillation output generating circuit. When a synchronizing pulse for synchronous oscillation is not inputted, self-advancing oscillation is started, and synchronous oscillation is started otherwise. When the synchronizing pulse is in an active state, a nullifying circuit inhibits transmission of an output from one of the first and second comparing circuits to the state maintaining circuit, whereas the nullifying circuit allows the above transmission when the synchronizing pulse is in an inactive state. Further, when the synchronizing pulse has shifted from the active state to the inactive state, an edge trigger circuit switches an output signal from the state maintaining circuit between a dropping signal and a rising signal.

9 Claims, 9 Drawing Sheets

SYNCHRONOUS OSCILLATION CIRCUIT OPERABLE IN SELF-ADVANCING OSCILLATION DURING ABSENCE OF SYNCHRONIZING PULSES

FIELD OF THE INVENTION

The present invention relates to a synchronous oscillation circuit which generates a synchronizing signal shaping a sawtooth waveform or a triangular waveform for use in a PWM (Pulse Width Modulation) circuit.

BACKGROUND OF THE INVENTION

Various types of synchronous oscillation circuits have been proposed, which generate a synchronizing signal shaping a sawtooth waveform or a triangular waveform for use in a so-called PWM (Pulse Width Modulation) circuit.

When employed as a power source IC of a digital machine, the above synchronous oscillation circuit normally operates in synchronous oscillation by using a signal in sync with an operating clock of a microcomputer provided in the machine as a synchronizing pulse. However, the synchronous oscillation circuit operates in self-advancing oscillation when the operating clock is not supplied stably, for example, at power-up.

FIG. 8 shows an example arrangement of the above synchronous oscillation circuit (Prior Art 1), and FIG. 9 shows a time chart to explain an operation of the circuit illustrated in FIG. 8.

As shown in FIG. 8, the synchronous oscillation circuit comprises a time constant means 51, a first voltage generating means 52, a second voltage generating means 53, a first comparing means 54, a second comparing means 55 a state maintaining means 56, and a logical OR circuit 57. The time constant means 51 raises or drops a voltage V0 (hereinafter, referred to simply as V0) over time. The first voltage generating means 52 generates a constant voltage V1 (hereinafter, referred to simply as V1), and the second voltage generating means 53 generates a constant voltage V2 (hereinafter, referred to simply as V2) which is lower than V1. The first comparing means 54 compares V0 with V1, and the second comparing means 55 compares V0 with V2. The state maintaining means 56 maintains a rising or dropping state of V0. The logical OR circuit 57 provides the state maintaining means 56 with a logical OR of an output from the second comparing means 55 and the synchronizing pulse.

Assume that the synchronizing pulse is in the LOW level (hereinafter, referred to simply as L), and V0 outputted from the time constant means 51 is rising at power-up as is shown at the top row in FIG. 9. Under these conditions, V0 keeps rising over time until it reaches V1, whereupon an output VH (hereinafter, referred to simply as VH) of the first comparing means 54 shifts to a HIGH level (hereinafter, referred to simply as H). Hence, an output of the state maintaining means 56 inverts, whereupon V0 starts to drop with the action of the time constant means 51. This dropping state of V0 is maintained by the state maintaining means 56 after VH has shifted to L due to the dropping of V0. When V0 drops as low as V2, an output VL (hereinafter, referred to simply as VL) of the second comparing means 55 shifts to H, and so does an output of the logical OR circuit 57. Hence, the state of the state maintaining means 56 inverts, whereupon V0 starts to rise again. By periodically repeating the above action, the circuit operates in the self-advancing oscillation, and in the meantime, V0 shapes a triangular waveform or a sawtooth waveform by rising to V1 and dropping to V2 repetitively.

Upon receipt of a synchronizing pulse having a cycle shorter than that of the self-advancing oscillation as shown at the bottom row in FIG. 9, the circuit starts to operate in the following manner. That is, as shown at the middle row in FIG. 9, an output from the logical OR circuit 57 shifts to H at the instant the synchronizing pulse shifts to H. Hence, the state of the state maintaining means 56 inverts, whereupon V0 starts to rise in sync with the rising-up of the synchronizing pulse. When V0 reaches V1, the state of the state maintaining means 56 inverts again, whereupon V0 starts to drop. Then, the state maintaining means 56 inverts its state again upon input of the following synchronizing pulse, whereupon V0 starts to rise again. By periodically repeating the above action, the circuit operates in the synchronous oscillation in sync with the synchronizing signal.

As previously mentioned, when employed as a power source IC of a digital machine, the synchronous oscillation circuit normally operates in the synchronous oscillation, and when the operating clock is not supplied stably, it operates in the self-advancing oscillation. Therefore, in order to stabilize the power source, it is ideal that the cycle of the synchronous oscillation is equal to that of the self-advancing oscillation.

In the conventional synchronous oscillation circuit described above, if the cycle of the synchronizing pulse is longer than that of the self-advancing oscillation, VL of the second comparing means 55 shifts to H before the synchronizing pulse does so, and the state of the state maintaining means 56 inverts at this shifting, thereby making normal synchronous oscillation impossible, For this reason, the cycle of the synchronizing pulse has to be shorter than that of the self-advancing oscillation. As a result, the oscillation cycle becomes shorter in the synchronous oscillation than in the self-advancing oscillation, and so does the oscillation amplitude.

The above problem is solved by the disclosure in Japanese Laid-Open Patent Application No. 216605/1989 (Japanese Official Gazette, Tokukaihei No. 1-2166605, Publishing Date: Aug. 30, 1989) (Prior Art 2). To be more specific, with the use of the arrangement of FIG. 8, a synchronizing pulse detecting circuit detects the absence or presence of the synchronizing pulse, and upon detection of the synchronizing pulse, V2 is dropped. Consequently, VL of the second comparing means 55 is nullified, thereby making the oscillation cycle and oscillation amplitude in the synchronous oscillation equal to those in the self-advancing oscillation.

In case that an oscillation waveform is a sawtooth waveform with a short rising period, if the synchronizing pulse has a large duty ratio, the timing of the falling edge of the synchronizing pulse comes after the peak timing of the oscillation waveform. Hence, two inputs, each assigning a conflicting function to the state maintaining means 56, compete against each other, thereby making normal oscillation impossible. For this reason, the duty ratio of the synchronizing pulse has be adequately small.

The synchronizing pulse shifts repetitively between H and L. Thus, according to the technique disclosed in aforementioned Japanese Laid-Open Patent Application No. 216605/ 1989, the synchronizing pulse detecting circuit has to confirm whether or not the synchronizing pulse has remained in L for a predetermined time before it detects the absence of the synchronizing pulse. Under these conditions, even though the synchronizing signal has been actually absent, VL of the second comparing means 55 is kept nullified until the absence of the synchronizing signal is confirmed. Hence, V0 as an oscillation output drops temporarily far below V2 which is the lower limit in the requirements, thereby causing problematic variance in oscillation amplitude.

Also, V2 is often grounded through a capacitor so as not to vary with a noise or interference with other circuits. Under these conditions, however, once V2 is lowered to nullify VL of the second comparing means 55, it takes a considerable time until V2 has been restored to the original voltage since the nullification is cancelled due to the absence of the synchronizing pulse. Consequently, the circuit can not smoothly shift to the self-advancing oscillation from the synchronous oscillation, and the oscillation cycle and oscillation amplitude remain unstable until the shifting is completed.

SUMMARY OF THE INVENTION

It is therefore an object of the present invention to provide a synchronous oscillation circuit capable of (1) having the oscillation cycle and oscillation amplitude on a voltage as an oscillation output in the self-advancing oscillation which are equal to those in the synchronous oscillation, so as to swiftly synchronize the voltage (the oscillation output) to the synchronizing pulse when the circuit shifts to the synchronous oscillation from the self-advancing oscillation; (2) preventing the voltage (the oscillation output) from dropping below the lower limit (V2) in requirements, and hence suppressing unwanted variance in the oscillation amplitude; and (3) realizing stable oscillation cycle and oscillation amplitude by smoothly shifting from the synchronous oscillation to the self-advancing oscillation when the synchronizing pulse is absent.

The above and other objects of the present invention are fulfilled by a synchronous oscillation circuit furnished with:

oscillation output generating means for generating a voltage (V0) as an oscillation output;

first comparing means for, upon detection that the voltage (V0) has become higher than a first constant voltage (V1), shifting a first output signal (VH) therefrom to an active state from an inactive state;

second comparing means for, upon detection that the voltage (V0) has become lower than a second constant voltage (V2), shifting a second output signal (VL) therefrom to an active state from an inactive state;

state maintaining means for, upon receipt of the first output signal (VH) shifted to the active state, outputting a dropping signal to the oscillation output generating means as a control signal which lowers the voltage (V0) over time, and upon receipt of the second output signal (VL) shifted to the active state, outputting a raising signal to the oscillation output generating means as the control signal which raises the voltage (V0) over time, the synchronous oscillation circuit operating in self-advancing oscillation in accordance with control of the state maintaining means over the oscillation output generating means when a synchronizing pulse for synchronous oscillation is not inputted, and when the synchronizing pulse is inputted, in the synchronous oscillation in sync with the synchronizing pulse;

nullifying means for, when the synchronizincl pulse is in the active state, choosing one of the first comparing means and second comparing means as a nullification target and inhibiting transmission of an output from the nullification target to the state maintaining means, and when the synchronizing pulse is in the inactive state, allowing the transmission of the output from the nullification target to the state maintaining means; and edge trigger means for, when the synchronizing pulse has shifted from the active state to the inactive state, inputting an inverting signal to the state maintaining means, the inverting signal switching the control signal outputted from the state maintaining means between the dropping signal and raising signal.

The following description will describe the control of timing at which V0 (the oscillation output) shifts to the rising state from the dropping state for ease of explanation. It should be appreciated, however, that the same explanation applies to a case where V0 shifts to the dropping state from the rising state.

Also, in the following explanation, a synchronizing pulse is in the active state at the HIGH level (hereinafter, referred to simply as H) and inactive state at the LOW level (hereinafter, referred to simply as L). It should be appreciated, however, that the synchronizing pulse may be in the active state at L and inactive state at H.

Further, an action to inhibit transmission of VL in the active state to the state maintaining means is referred to as "nullification".

The state maintaining means is arranged in such a manner as to invert between two states: (1) a rising control state where it outputs the rising signal which raises V0 over time to the oscillation output generating means; and (2) a dropping control state where it outputs the dropping signal which drops V0 over time to the oscillation output generating means. The state maintaining means is also arranged in such a manner as to control the oscillation output generating means to maintain the current rising/dropping state of V0 unless either VH in the active state or VL in the active state is transmitted.

Broadly speaking, the above arrangement has the following characteristics.

(1) The above arrangment realizes the following:

(a) When the synchronizing pulse is in the inactive state, VL of the second comparing means is transmitted to the state maintaining means by directly passing through the nullifying means and edge trigger means, whereby the self-advancing oscillation is started. During the self-advancing oscillation, V0 varies between V1 and V2 as does in the conventional manner as shown in a period d of FIG. 3;

(b) When the synchronizing pulse is in the active state, in other words, when the synchronizing pulse is inputted, the control is performed differently in two cases: (i) the cycle of the synchronizing pulse is longer than that of the self-advancing oscillation; and (ii) the former is shorter than the latter.

In case of (i) where the cycle of the synchronizing pulse is longer than that of the self-advancing oscillation as shown in a period b of FIG. 3, even if V0 (the oscillation output) drops below V2 and VL shifts to the active state correspondingly, VL is kept nullified by the nullifying means at this point because the synchronizing pulse remains in the active state. Consequently, VL is not transmitted to the state maintaining means, and the dropping state of V0 is maintained. At the instant the synchronizing pulse shifts to the inactive state from the active state, the nullification of VL is cancelled, whereupon VL is transmitted to the state maintaining means. Consequently, the state maintaining means inverts its state, whereby V0 stops dropping and starts rising.

In case of (ii) where the cycle of the synchronizing pulse is shorter than that of the self-advancing oscillation, as shown in a period a of FIG. 3, at the instant the synchronizing pulse shifts to the inactive state from the active state, the edge trigger means generates the inverting signal and transmits the same to the state maintaining means, whereby the state maintaining means inverts its state. Consequently, V0 stops dropping and starts rising.

When the synchronizing pulse is absent (in the inactive state), VL of the second comparing means directly passes through the nullifying means and edge trigger means again.

As can be understood from the cases (i) and (ii) when the synchronizing pulse is in the active state, the voltage (the oscillation output) shifts to the rising state from the dropping state independently of the cycle of the self-advancing oscillation at the timing determined by the synchronizing pulse not only in the case (ii) where the cycle of the synchronizing pulse is shorter than that of the self-advancing oscillation, but also in the case (i) where the former is longer than the latter. Consequently, in either case, the oscillation output shapes a triangular waveform or a sawtooth waveform in sync with shifting of the synchronizing pulse to the inactive state from the active state. Also, it is understood from the foregoing that, as shown in a period c of FIG. 3, the same result can be obtained when the cycle of the self-advancing oscillation is equal to that of the synchronizing pulse.

In other words, the circuit of the present invention is different from the conventional circuit (Prior Art 1) in that the cycle of the voltage (the oscillation output) can be synchronized to the cycle of the synchronous oscillation even if the cycle of the synchronizing pulse is equal to that of the self-advancing oscillation, and therefore, it is no longer necessary to set the former shorter than the latter. Consequently, the oscillation cycle and oscillation amplitude on the voltage (the oscillation output) in the self-advancing oscillation can be equal to those in the synchronous oscillation.

Further, the voltage (the oscillation output) can be swiftly synchronized to the synchronizing pulse when the circuit shifts to the synchronous oscillation from the self-advancing oscillation.

(2) Under the conditions where the oscillation cycle and oscillation amplitude in the self-advancing oscillation are equal to those in the synchronous oscillation, the nullification of VL is cancelled at the instant the synchronizing pulse shifts to the inactive state. In other words, the circuit of the present invention is different from the conventional circuit (Prior Art 2) in that the nullification of VL can be cancelled immediately without waiting for the detection of complete absence of the synchronizing pulse. Hence, V0 (the oscillation output) will not drop far below V2 even temporarily. Consequently, it has become possible to control V0 (the oscillation output) not to drop below the lower limit in requirements (V2), thereby suppressing unwanted variance in the oscillation amplitude.

(3) Further, as has been discussed, because the circuit of the present invention is different from the conventional circuit (Prior Art 2) in that V2 does not have to be lowered, when the synchronizing pulse is absent, no time is lost in waiting for V2 to be resorted to the original value, thereby realizing stable oscillation cycle and oscillation amplitude by smoothly shifting to the self-oscillation.

For a fuller understanding of the nature and advantages of the invention, reference should be made to the ensuing detailed description taken in conjunction with the accompanying drawings.

DESCRIPTION OF THE EMBODIMENTS
Embodiment 1

Figure 1:
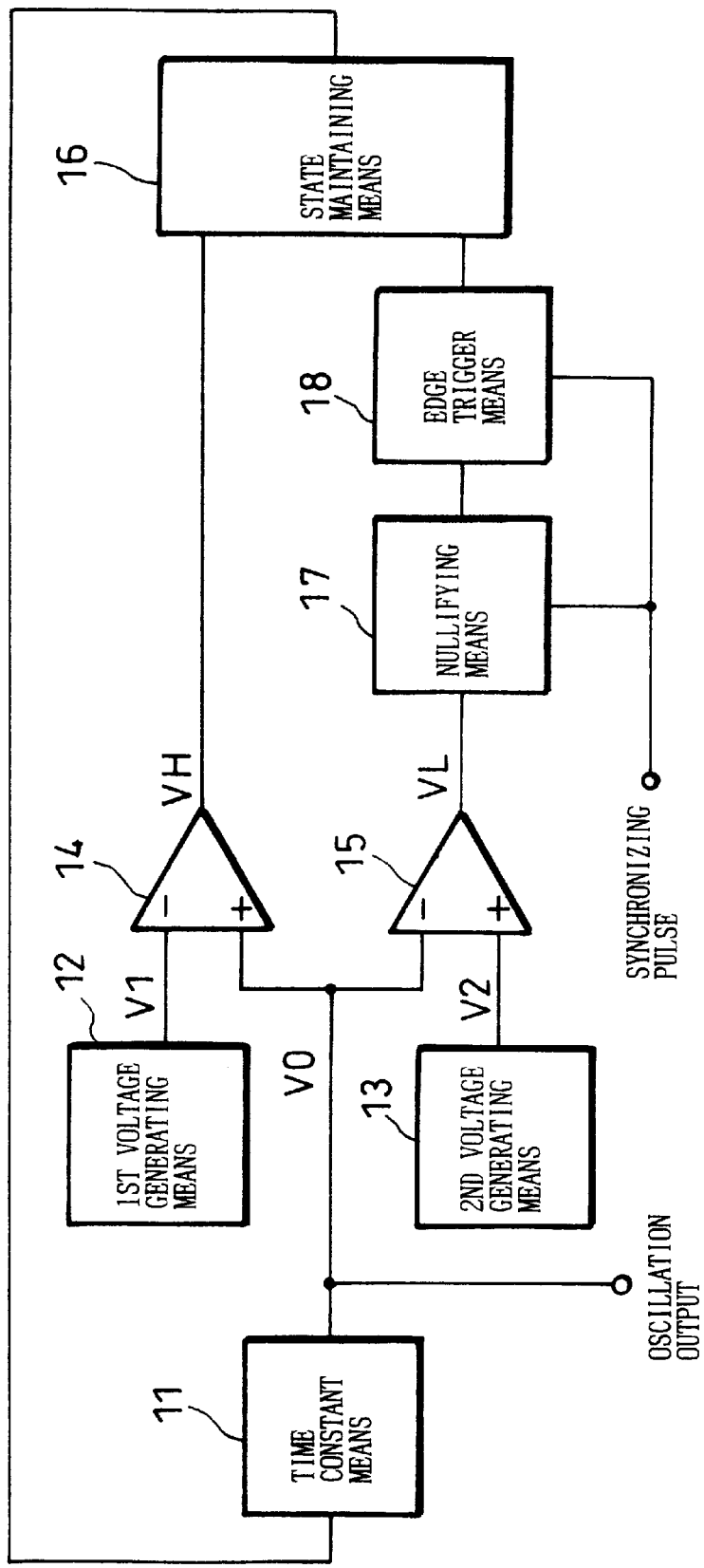
FIG. 1 is a block diagram depicting an example arrangement of a synchronous oscillation circuit in accordance with the present invention.
Figure 2:
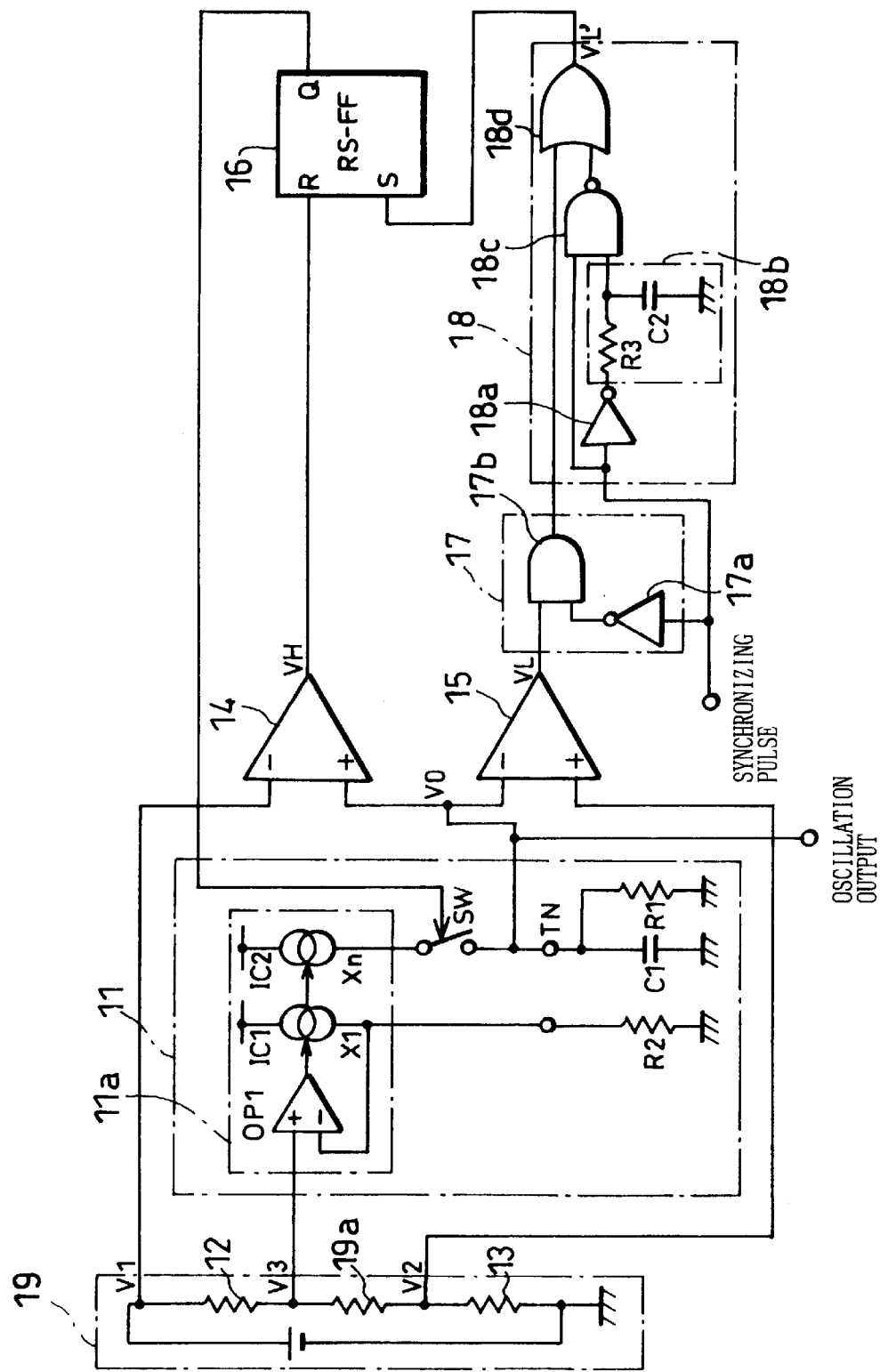
FIG. 2 is a circuit diagram depicting a circuitry arrangement of the synchronous oscillation circuit of FIG. 1.
Figure 3:
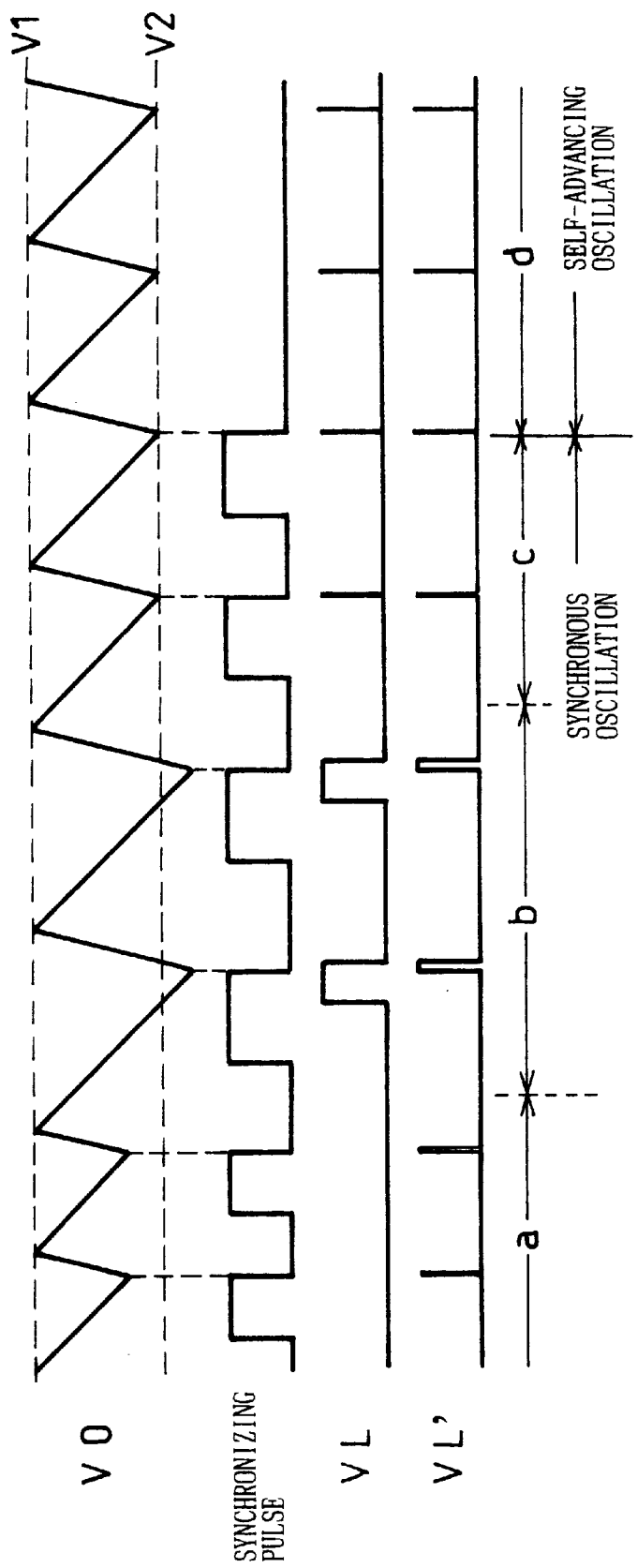
FIG. 3 is a time chart showing a voltage waveform and pulses for the synchronous oscillation circuit of FIG. 1.

Referring to FIGS. 1 through 3, the following description will describe an example embodiment of the present invention.

A synchronous oscillation circuit of the present embodiment generates a synchronizing signal shaping a sawtooth waveform or a triangular waveform for use in a so-called PWM (Pulse Width Modulation) circuit. When employed as a power source IC of a digital machine, the synchronous oscillation circuit normally operates in synchronous oscillation by using a signal in sync with an operating clock of a microcomputer provided in the machine as a synchronizing pulse. On the other hand, the circuit operates in self-advancing oscillation when the operating clock is not supplied stably, for example, at power-up.

FIG. 1 is a block diagram depicting an example arrangement of the synchronous oscillation circuit of the present embodiment, and FIG. 2 is a circuit diagram depicting a circuitry arrangement of the synchronous oscillation circuit of FIG. 1. As shown in FIGS. 1 and 2, the synchronous oscillation circuit comprises a time constant means (oscillation output generating means) 11, a first voltage generating means 12, a second voltage generating means 13, a first comparing means 14, a second comparing means 15, a state maintaining means 16, a nullifying means 17, and an edge trigger means 18. The time constant means 11 raises or drops a voltage V0 (hereinafter, referred to simply as V0) over time. The first voltage generating means 12 generates a constant voltage V1 (hereinafter, referred to simply as V1), and the second voltage generating means 13 generates a constant voltage V2 (hereinafter, referred to simply as V2) which is lower than V1. The first comparing means 14 compares V0 with V1, and the second comparing means 15 compares V0 with V2. The state maintaining means 16 maintains a rising or dropping state of V0.

When the synchronizing pulse is in the HIGH level (hereinafter, referred to simply as H), the nullifying means 17 chooses one of the first comparing means 14 and second comparing means 15 as a nullification target (herein, the second comparing means 15) and inhibits transmission of an output from the nullification target to the state maintaining means 16. On the other hand, when the synchronizing pulse is in the LOW level (hereinafter, referred to simply as L), the nullifying means 17 allows the above transmission.

The edge trigger means 18 transmits an inverting signal VL' (hereinafter, referred to simply as VL') to the state maintaining means 16 at the instant the synchronizing pulse shifts to L from H. Here, VL' switches an output signal from the state maintaining means 16 to a signal which raises V0 (turns ON a switch SW described below) from a signal which lowers V0 (turns OFF the switch SW).

As shown in FIG. 2, the first voltage generating means 12 and second voltage generating means 13 are provided in a power source 19 formed as an integral part of an IC with an intermediate voltage source 19a inbetween so as to serve as a resistive divided voltage source. In other words, constant voltages V1, V3, and V2 (V1>V3>V2) are generated by the resistive dividers in the voltage source 19, which form the first voltage generating means 12, intermediate voltage source 19a, second voltage generating means 13, respectively.

The time constant means 11 has a constant current generating means 11a composed of an IC, and the constant current generating means 11a includes an operational amplifier OP1, a first constant current source IC1, and a second constant current source IC2, which are sequentially connected to the intermediate voltage source 19a in this order. Connected to the first constant current source IC1 is a resistor R2 which is attached to the outside of the IC (hereinafter, "external" is used to describe that a component in question is attached to the outside of the IC). The operational amplifier OP1 controls the first and second constant current sources IC1 and IC2 in such a manner as to generate V3 across the resistor R2. The first and second constant current sources IC1 and IC2 respectively generate constant currents X1 and X2 in a current ratio of 1:n. In other words, the current X2 flowing through the second constant current source IC2 is n times as large as the current X1 flowing through the first constant current source IC1.

The output of the second current source IC2 is connected to both an external capacitor C1 and an external resistor RT, which are connected in parallel to each other, through an external analog switch SW (opening/closing means). The capacitor C1 and resistor R1 are grounded at their respective ends opposite to the switch SW side, and the other ends of the capacitor C1 and resistor R1 at the switch SW side form a terminal referred to as a non-grounded terminal TN. An output from the non-grounded terminal TN is the output from the time constant means 11, namely V0 (the oscillation output). The circuit discharges charges from the capacitor C1 through the resistor R1 when the switch SW stays OFF, and as a consequence, V0 starts to drop. On the other hand, when the switch SW stays ON, the capacitor C1 is charged with charges by the second constant current source IC2, and as a consequence, V0 starts to rise.

Each of the first comparing means 14 and second comparing means 15 is composed of a comparator. The first comparing means 14 is connected to both the non-grounded terminal TN and first voltage generating means 12, while the second comparing means 15 is connected to both the non-grounded terminal TN and second voltage generating means 13.

The state maintaining means 16 is composed of an RS flip-flop. An output signal VH (hereinafter, referred to simply as VH) of the first comparing means 14 is connected to the reset input (R) of the RS flip-flop. An output signal VL (hereinafter, referred to simply as VL) of the second comparing means 15 is connected to the set input (S) of the RS flip-flop through the nullifying means 17 and edge trigger means 18 in this order. The output (Q) of the RS flip-flop is connected to the switch SW. The above arrangement realizes a synchronous oscillation circuit.

The nullifying means 17 is composed of an inverter 17a and an AND gate 17b. The inverter 17a receives the synchronizing pulse during the synchronous oscillation. The AND gate 17b receives both an output from the inverter 17a and the output from the second comparing means 15.

The edge trigger means 18 is composed of an inverter 18a, a differential circuit 18b, a NAND gate 18c, and an OR gate 18d, which are connected sequentially in this order. The differential circuit 18b is composed of a capacitor C2 and a resistor R3. The inverter 18a receives the synchronizing pulse during the synchronous oscillation. The OR gate 18d receives an output of the AND gate 17b in the nullifying means 17.

Next, the following will explain an operation of the above-arranged synchronous oscillation circuit. In the present embodiment, the input synchronizing pulse is in the active state at H, and inactive state at L. It should be appreciated, however, that the synchronizing pulse may be in the inactive state at H and active state at L. This alternative arrangement can be realized by, for example, providing an inverter before the input of the synchronizing pulse.

To begin with, the operation in the self-advancing oscillation will be explained. The first voltage generating means 12, intermediate voltage source 139a, and second voltage generating means 13 generate V1, V3, and V2, respectively. The operational amplifier OP1 generates V3 across the resistor R2. The first constant current source IC1 and second constant current source IC2 respectively generate constant currents X1 and X2 in a current ratio of 1:n. The output of the second constant current source IC2 is inputted into both the first comparing means 14 and second comparing means 15 as V0, namely, the output of the time constant means 11. The first comparing means 14 compares V0 with V1 outputted from the first voltage generating means 12, and outputs VH as the comparison result. The second comparing means 15 compares V0 with V2 outputted from the second voltage generating means 13, and outputs VL as the comparison result.

Then, VH of the first comparing means 14 is inputted into the reset input (R) of the RS flip-flop, and VL of the second comparing means 15 passes through the nullifying means 17 first and thence the edge trigger means 18, and enters into the set input (S) of the RS flip-flop serving as the state maintaining means 16.

Then, upon input of the output Q of the state maintaining means 16, the switch SW is turned ON, whereby the capacitor C1 is charged with charges by the second constant current source IC2, and V0 (the oscillation output) starts to rise exponentially over time.

When the first comparing means 14 detects that V0 has risen as high as V1, VH shifts to H and enters into the reset input (R) of the state maintaining means 16. Consequently, the switch SW is turned OFF upon input of the output Q of the state maintaining means 16, whereby the capacitor C1 starts to discharge the charges through the resistor R1. Accordingly, V0 starts to drop from V1 to V2 exponentially over time.

When the second comparing means 15 detects that V0 has dropped as low as V2, VL shifts to H and enters into the set input (S) of the state maintaining means 16. Here, since the synchronizing pulse is not inputted, that is, the synchronizing pulse is in the inactive state, VL passes directly through the nullifying means 17 and edge trigger means 18. Consequently, the output Q of the state maintaining means 16 is inputted into the switch SW, whereupon the switch SW is turned ON. Then, because the capacitor C1 is charged with a current, which is in effect a difference between the current X2 of the second constant current source IC2 and a current flowing through the resistor R1, V0 starts to rise from V2 to V1 exponentially over time.

Figure 9:
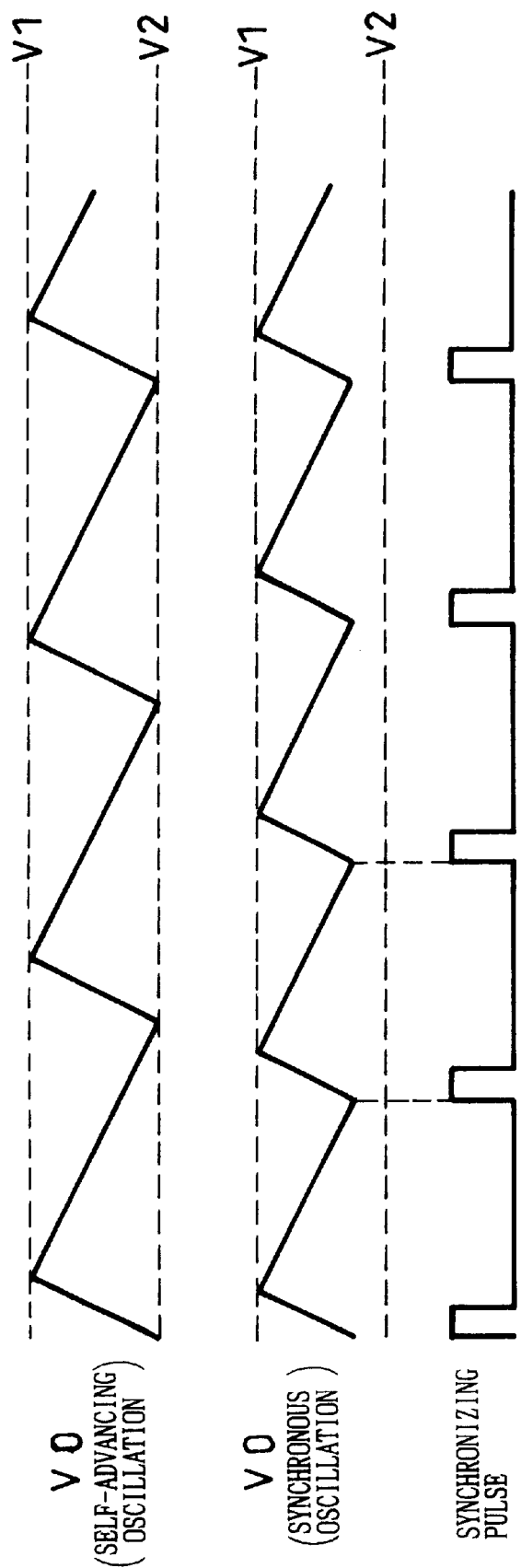
FIG. 9 is a time chart showing waveforms and a pulse for the conventional synchronous circuit.

While the above action is repeated, a triangular waveform or a sawtooth waveform shown at the top row in FIG. 9 and in a period d in FIG. 3 is formed as the waveform of V0 (the oscillation output) by the self-advancing oscillation like in the conventional method.

Next, the operation in the synchronous oscillation will be explained. An oscillation output amplitude varies when the cycle of the synchronizing pulse is different from that of the self-advancing oscillation, and in the present embodiment, the higher potential side of the oscillation output is maintained at V1, so that the lower potential side will vary.

In the first place, the entire operation in the synchronous oscillation will be briefly described. That is, when the synchronizing pulse is in L, the output of the second comparing means 15 is transmitted to the set input (S) of the state maintaining means 16 by directly passing through the nullifying means 17 and edge trigger means 18. When the output of the second comparing means 15 is in H, the state maintaining means 16 transmits a signal which closes the switch SW to the switch SW, thereby turning ON the switch SW. Consequently, V0 starts to rise.

When the synchronizing pulse is in H, the output of the second comparing means 15 is nullified by the nullifying means 17. When the synchronizing pulse shifts to L from H, H is transmitted to the set input (S) of the state maintaining means 16 by the edge trigger means 18 independently of the output of the second comparing means 15. Hence, the state maintaining means 16 transmits a signal which closes the switch SW to the switch SW, thereby turning ON the switch SW. Consequently, V0 starts to rise.

In either case, when V0 has risen as high as V1, the first comparing means 14 inputs H into the reset input (R) of the state maintaining means 16. Then, the state maintaining means 16 transmits a signal which opens the switch SW, thereby turning OFF the switch SW. Consequently, V0 starts to drop.

Next, the operation in the synchronous oscillation will be explained in detail. FIG. 3 is a time chart showing a voltage waveform and pulses for the synchronous oscillation circuit of FIG. 1. In the event of Case #1 where the cycle of the synchronizing pulse is longer than that of the self-advancing oscillation, as shown in a period b in FIG. 3, even when V0 (the oscillation output) drops below V2 and VL shifts to H correspondingly, the nullifying means 17 keeps nullifying VL at this point because the synchronizing pulse remains in H. Consequently, transmission of VL to the state maintaining means 16 is not allowed, and the state maintaining means 16 maintains the dropping state of V0. At the instant the synchronizing pulse shifts to L from H, the nullification on VL is cancelled, whereby transmission of VL to the state maintaining means 16 is allowed. Consequently, the state maintaining means 16 inverts its state, whereupon V0 stops dropping and starts rising.

In the event of Case #2 where the cycle of the synchronizing pulse is shorter than that of the self-advancing oscillation, as shown in a period a in FIG. 3, at the instant the synchronizing pulse shifts to L from H, the edge trigger means 18 shifts its output signal to H and transmits the same to the state maintaining means 16, thereby inverting the state of the state maintaining means 16. Consequently, V0 stops dropping and starts rising.

When the synchronizing pulse is absent, VL of the second comparing means 15 passes directly through the nullifying means 17 and edge trigger means 18 again.

It is understood from the foregoing that, when the synchronizing pulse is in H, V0 (the oscillation output) stops dropping and starts rising at timing determined by the synchronizing pulse independently of the cycle of the self-advancing oscillation either in Case #2 where the cycle of the synchronizing pulse is shorter than that of the self-advancing oscillation or Case #1 where the former is longer than the latter. Hence, in either case, the oscillation output shapes a triangular waveform or a sawtooth waveform which synchronizes to the shifting of the synchronizing pulse from H to L. It is also understood from the foregoing that similar results can be obtained when the cycle of the self-advancing oscillation is substantially equal to that of the synchronizing pulse as is in a period c in FIG. 3.

In other words, the arrangement of the circuit of the present embodiment is different from that of the conventional circuit in that the cycle of V0 (the oscillation output) can be matched with that of the synchronous oscillation even if the cycle of the synchronizing pulse is substantially equal to that of the self-advancing oscillation, so that the former does not have to be set shorter than the latter. Consequently, the oscillation cycle and oscillation amplitude on V0 (the oscillation output) in the self-advancing oscillation can be equal to those in the synchronous oscillation.

Therefore, V0 (the oscillation output) can be swiftly synchronized to the synchronizing pulse at the shifting from the self-advancing oscillation to the synchronous oscillation.

Also, because the nullifying means and edge trigger means can be realized by a small digital circuit as has been discussed above, they can be suitably formed as an integral part of an IC.

Here, assume that the input synchronizing pulse is in L, and the synchronous oscillation circuit is operating in the self-advancing oscillation as has been discussed.

Then, when the switch SW stays OFF, ti, which is the time necessary for V0 to drop from V1 to V2 exponentially as has been discussed above, can be found by Equation (1):

$$t1 = C1 \cdot R1 \cdot \ln(V1/V2). \tag{1}$$

When the switch SW stays ON, t2, which is the time necessary for V0 to rise from V2 to V1 exponentially as has been discussed above, can be found by Equation (2):

$$t2 = C1 \cdot R1 \cdot \ln\frac{n \cdot (R1/R2) \cdot V3 - V1}{n \cdot (R1/R2) \cdot V3 - V2}. \tag{2}$$

The oscillation cycle t is defined as t=t1+t2, and a duty ratio d is defined as d=t1/t. Hence, from Equations (1) and (2), the oscillation cycle t and duty ratio d are respectively found by Equations (3) and (4):

$$t = C1 \cdot R1 \cdot \ln\frac{(V1/V2) \cdot \{n \cdot (R1/R2) \cdot V3 - V1\}}{n \cdot (R1/R2) \cdot V3 - V2} \tag{3}$$

$$d = \frac{\ln(V1/V2)}{\ln\frac{(V1/V2) \cdot \{n \cdot (R1/R2) \cdot V3 - V1\}}{n \cdot (R1/R2) \cdot V3 - V2}}. \tag{4}$$

Since V2 and V3 are obtained by resistive-dividing V1, even if V1 varies, a ratio between V2 and V3 remains the same. Thus, if constants k2 and k3 are defined so as to satisfy: V2=k2·V1 and V3=k3·V1, substituting these constants into Equations (3) and (4) yields Equations (5) and (6):

$$t = C1 \cdot R1 \cdot \ln\frac{(1/k2) \cdot \{n \cdot (R1/R2) \cdot k3 - 1\}}{n \cdot (R1/R2) \cdot k3 - k2} \quad (5)$$

$$d = \frac{\ln(1/k2)}{\ln\dfrac{(1/k2) \cdot \{n \cdot (R1/R2) \cdot k3 - 1\}}{n \cdot (R1/R2) \cdot k3 - k2}}. \quad (6)$$

Equations (5) and (6) reveal that the oscillation cycle t and duty ratio d are determined only by the external resistors R1 and R2, external capacitor C1, a voltage ratio within the voltage source 19 composed of an IC (that is, resistance ratios k2 and k3), and a current ratio n of the second constant current to the first constant current, and are not affected by any other factor. Hence, when the circuit is formed as an integral part of an IC, the oscillation cycle and duty ratio are least affected by variance among a number of circuit elements forming the IC.

By using the IC, not only can the current ratio n and voltage ratio be accurate, but also highly accurate external resistor and capacitor can be readily obtained. Hence, with the synchronous oscillation circuit of the present embodiment, precise oscillation cycle and duty ratio can be readily obtained.

In addition, the oscillation cycle and duty ratio can be set independently by the external resistor and capacitor. To be more specific, the duty ratio d is set by choosing the resistors R1 and R2 in accordance with Equation (6). Then, the oscillation cycle t is set by choosing the capacitor C1 adequately in accordance with Equation (5) with the resistors R1 and R2 thus chosen.

For example, the synchronous oscillation circuit of the present embodiment can be employed for a PWM circuit, which is a step-up type DC-to-DC convertor adopting a PWM control method, and whose dead band width (the largest duty ratio of a switching pulse) is determined by a duty ratio of the sawtooth waveform outputted from the synchronous oscillation circuit. In other words, by choosing the external resistor and capacitor as discussed above, the dead band width and PWM cycle having arbitrary values can be obtained in a precise manner with the synchronous oscillation circuit of the present embodiment. When the dead band width becomes smaller than a threshold value, the step-up type DC-to-DC convertor can no longer operate. Hence, it is necessary to keep the smallest dead band width larger than the threshold value. Thus, in case of a circuit with which the dead band width can not be set accurately, the dead band width has to be set with a sufficient margin from the start, but this lowers efficiency. In contrast, the synchronous oscillation circuit of the present embodiment can approximate the dead band width to the threshold value, and therefore, contribute to improvement of efficiency.

Ideal output impedance of each of the first and second constant current sources IC1 and IC2 is infinite. However, because the first and second constant current sources IC1 and IC2 are composed of a bipolar transistor or a MOSFET, the output impedance has a finite value. In particular, when these components are composed of a MOSFET, the output impedance is relatively small, and a current value varies considerably with voltages at the output ends of the first and second constant current sources IC1 and IC2. This may change the current ratio n of the second constant current source IC1 to the first constant current source and IC2. Here, V1, V2, and V3 are set so as to satisfy:

$$V3 = (V1 + V2)/2. \quad (7)$$

Because V0 is the voltage at the output end of the second constant current source IC2, and it varies linearly from V1 and V2, the right side of Equation (7) is an average of V0 at the output end of the second constant current source IC2. This makes V3 at the output end of the first constant current source IC1 equal to an average of V0 at the output end of the second constant current source IC2. In short, voltage values (averages) at both of the constant current sources are equal. Hence, even if the output impedance of each of the constant current sources IC1 and IC2 is low, a ratio n of the current X2 of the second constant current source IC2 to the current X1 of the first constant current source IC1 can be maintained in a precise manner, thereby improving accuracy of the oscillation cycle and duty ratio.

If the cycle of the synchronous oscillation becomes longer than that of the self-advancing oscillation by a threshold limit value or greater, VL directly passes through the nullifying means, and when this happens, upon input of the synchronizing pulse, the circuit does not start the synchronous oscillation but the self-advancing oscillation like the conventional synchronizing oscillation circuit. In order to solve this problem, in the present embodiment, as one of the conditions to start the synchronous oscillation, the cycle of the self-advancing oscillation, that of the synchronous oscillation, and a duty ratio of the synchronizing pulse are set to satisfy Equation (8) set forth below, that is, so as not to exceed the above predetermined limit value:

cycle of self-advancing oscillation ≧ cycle of synchronous oscillation × duty ratio of the synchronizing pulse. (8)

For example, inputting a synchronizing pulse with a 50% duty ratio can trigger the synchronous oscillation if the cycle of the self-advancing oscillation is at least two times as long as that of the synchronizing oscillation. The synchronizing pulse with a 50% duty ratio can be readily obtained by means of dividing or the like. Thus, even if the duty ratio of the synchronizing pulse is large to some extent, the circuit can operate in the synchronous oscillation without causing any trouble.

As has been discussed, the synchronous oscillation circuit of the present embodiment comprises the oscillation output generating means including:

an intermediate voltage source for generating V3 which is equal to an average of V1 and V2;

a second resistor R2;

a first constant current source for generating a constant current X1 flowing through the second resistor R2 by applying V3 to the second resistor R2;

a second constant current source for generating a constant current X2 which is n times as large as the constant current X1;

a first capacitor C1 and a first resistor R1, which are connected in parallel and grounded at their respective ends at one side; and opening/closing means for raising/lowering a voltage at a non-grounded terminal TN of the first capacity C1 and first resistor R1 by switching an ON/OFF state of the constant current X2 with respect to the non-grounded terminal TN, wherein a voltage outputted from the non-grounded terminal TN is V0 (the oscillation output).

According to the above arrangement, an output voltage of the first constant current source is V3, which is equal to an average of V1 and V2. On the other hand, an output voltage of the second constant current source is V0 (the oscillation output), which varies between V1 and V2 as described above. In other words, the voltage (V3) applied on the first constant current source is equal to an average of the voltage (V0) applied on the second constant current source. Hence, even when output impedance from each of the first and second constant current sources is small, a current ratio n of the second constant current source to the first constant current source can be maintained in a precise manner. In short, R1, R2, C1, V1, V2, V34 and n can be maintained in a precise manner. Here, because the oscillation cycle t and duty ratio d can be found from Equations (5) and (6) above, accuracy of the oscillation cycle and duty ratio can be further improved.

Embodiment 2

Figure 4:
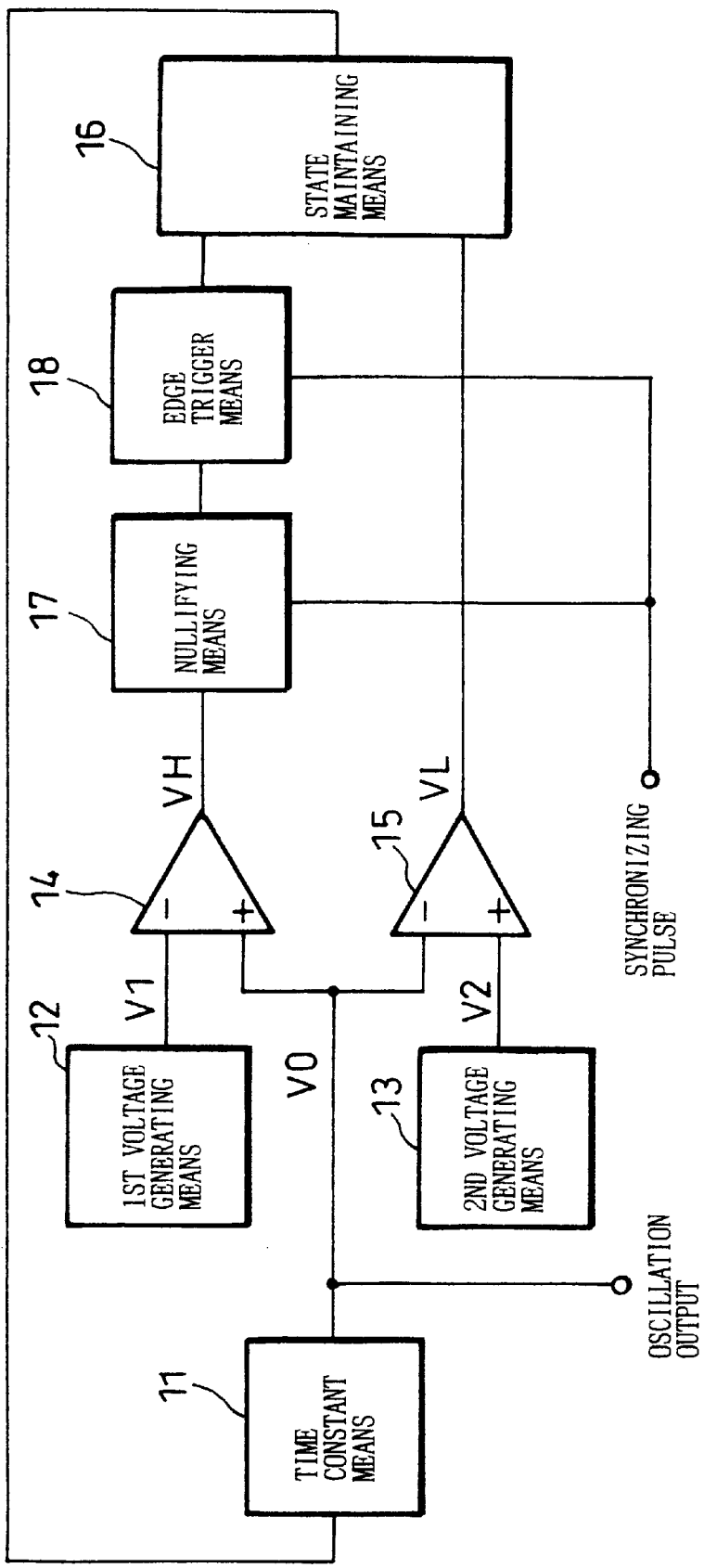
FIG. 4 is a block diagram depicting another example arrangement of a synchronous oscillation circuit in accordance with the present invention.
Figure 5:
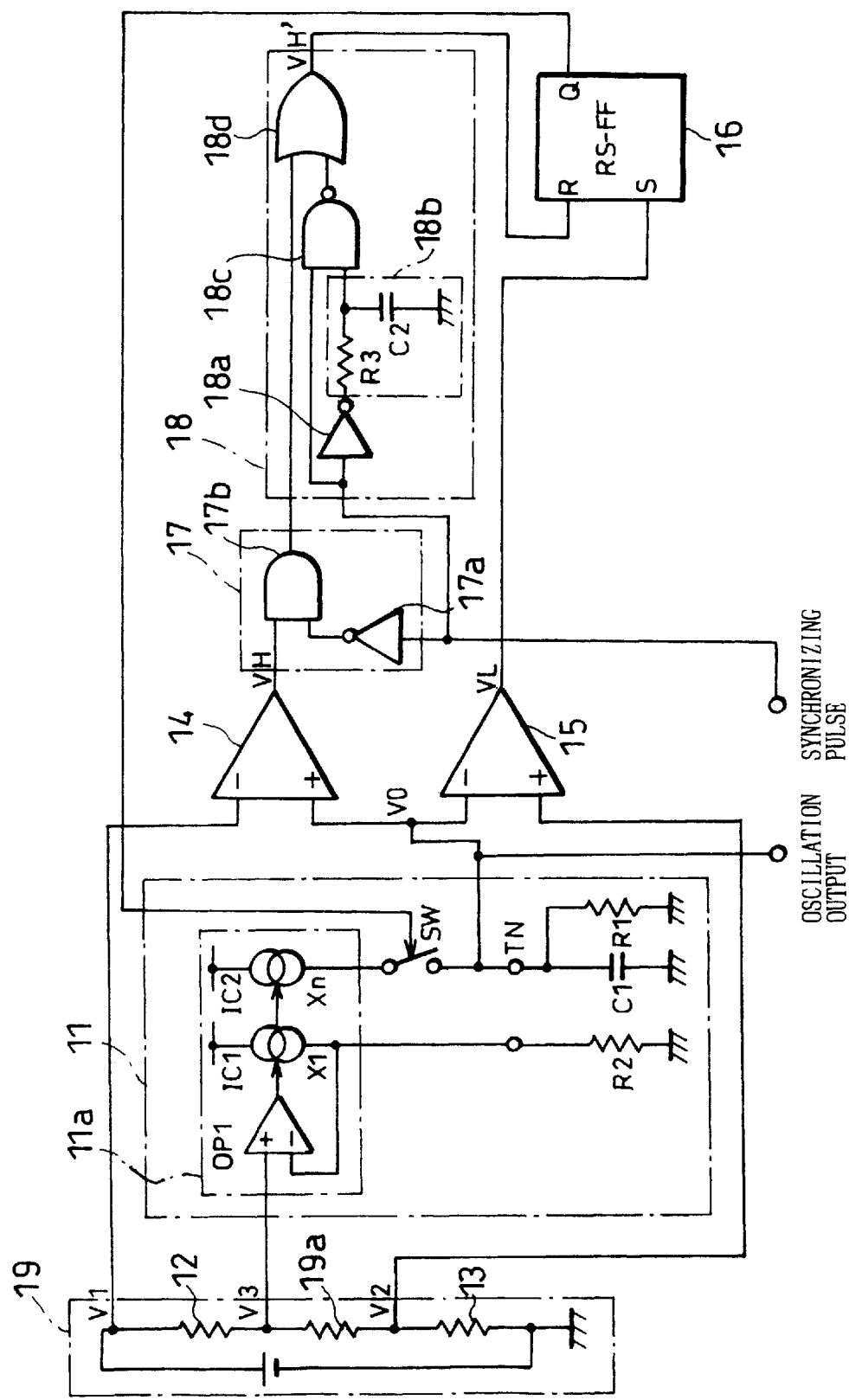
FIG. 5 is a circuit diagram showing a circuitry arrangement of the synchronous oscillation circuit of FIG. 4.

Referring to FIGS. 4 and 5, the following description will describe another example embodiment of the present invention. Hereinafter, like components are labeled with like reference numerals with respect to Embodiment 1, and the description of these components is not repeated for ease of explanation.

FIG. 4 is a block diagram depicting an example arrangement of a synchronous oscillation circuit of the present embodiment, and FIG. 5 is a circuit diagram depicting a circuitry arrangement of the synchronous oscillation circuit of FIG. 4. As shown in FIGS. 4 and 5, the present embodiment is different from Embodiment 1 in that the output of the first comparing means 14 is connected to the reset input (R) of the state maintaining means 16 through the nullifying means 17 and edge trigger means 18, and the output of the second comparing means 15 is directly connected to the set input (S) of the state maintaining means 16.

The amplitude of the oscillation output varies when the cycle of the synchronizing pulse and that of the self-advancing oscillation are different, and in the present embodiment, the lower potential side of the oscillation output is maintained at V2, so that the higher potential side will vary.

At the instant the synchronizing pulse shifts to L from H, the edge trigger means 18 transmits an inverting signal VH' (hereinafter, referred to simply as VH') to the state maintaining means 16. Here, VH' shifts an output signal of the state maintaining means 16 to a signal which drops V0 (turns OFF the switch SW) from a signal which raises V0 (turns ON the switch SW).

The operation of the circuit of the present embodiment is basically the same as that of its counterpart in Embodiment 1. That is, when the synchronizing pulse is in LH the output of the first comparing means 14 is transmitted to the reset input (R) of the state maintaining means 16 by directly passing through the nullifying means 17 an d edge trigger means 18. When the output of the first comparing means 14 is in H, the state maintaining means 16 transmits a signal which opens the switch SW to the switch SW, thereby turning OFF the switch SW. Consequently, V0 starts to drop.

When the synchronizing pulse is in H, the output of the first comparing means 14 is nullified by the nullifying means 17. When the synchronizing pulse shifts to L from H, the edge trigger means 18 transmits H to the reset input (R) of the state maintaining means 16 regardless of the output of the first comparing means 14. Accordingly, the state maintaining means 16 transmits a signal which opens the switch SW, thereby turning OFF the switch SW. Consequently, V0 starts to drop.

In either case, when V0 drops as low as V2, the second comparing means 15 transmits H to the set input (S) of the state maintaining means 16. Accordingly, the state maintaining means 16 sends a signal which closes the switch SW to the switch SW, thereby turning ON the switch SW. Consequently, V0 starts to rise.

Embodiment 3

Figure 6:
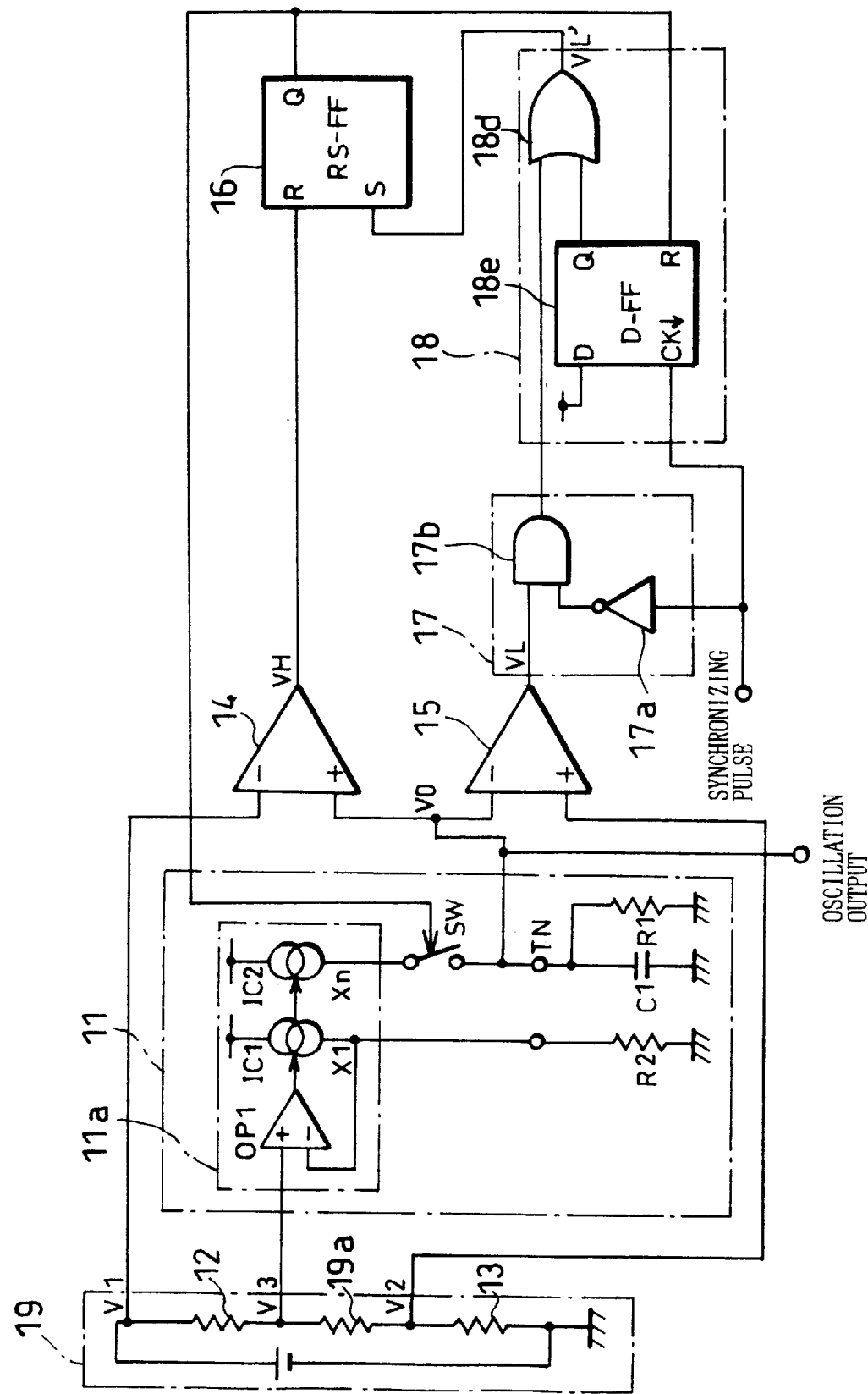
FIG. 6 is a circuit diagram depicting still another example circuitry arrangement of a synchronous oscillation circuit in accordance with the present invention.

Referring to FIG. 6, the following description will describe still another example embodiment of the present invention. Hereinafter, like components are labeled with like reference numerals with respect to the above embodiments, and the description of these components is not repeated for ease of explanation.

FIG. 6 is a circuit diagram depicting still another example circuitry arrangement of a synchronous oscillation circuit of the present embodiment. As shown in FIG. 6, the present embodiment is different from Embodiment 1 in that the edge trigger means 18 is not composed of a differential circuit, but a D flip-flop 18e and an OR gate 18d, and that the synchronizing pulse is inputted into the CK of the D flip-flop 18e, and an output Q thereof is inputted into the OR gate 18d, while the reset input (R) thereof is connected to the output Q of the RS flip-flop serving as the state maintaining means 16.

When the synchronizing pulse shifts to L from H, the D flip-flop 18e is triggered and the output Q of the D flip-flop 18e shifts to H, whereby the state maintaining means 16 is set. Consequently, the output Q of the state maintaining means 16 shifts to H, and the output Q is inputted into the reset input (R) of the D flip-flop 18e. Accordingly, the D flip-flop 18e is reset, whereby the output Q shifts back to L.

In case that the edge trigger means is composed of a differential circuit like in Embodiment 1 or 2, if the differential time constant is too small, the state maintaining means 16 can not be triggered in a reliable manner. On the other hand, if the differential time constant is too large, the output of the edge trigger means 18 does not shift to L until the VH of the first comparing means 14 shifts to H. In other words, since it takes a time for the output of the edge trigger means 18 to shift to L, VH of the first comparing means 14 shifts to H before the output of the edge trigger means 18 shifts to L, thereby making a normal oscillation operation impossible. In order to prevent such a problem, the time constant has to be determined carefully.

In contrast, according to the arrangement of the present embodiment, upon confirmation of the operation of the state maintaining means 16, the edge trigger means 18 immediately stops outputting a trigger pulse (VL') to the state maintaining means 16, thereby eliminating such a trouble. In addition, when the differential circuit is formed as an integral part of an IC, the resistor and capacitor occupy a large area. However, since the circuit of the present embodiment can omit the resistor and capacitor, the edge trigger means occupies only a small area in the IC. This is advantageous in saving manufacturing costs.

As has been discussed above, the synchronous oscillation circuit of the present embodiment is arranged in such a manner that the edge trigger means stops inputting the inverting signal into the state maintaining means upon detection of the state inversion thereof.

For example, in case that the edge trigger means is composed of a differential circuit, if a differential time constant is too small, the inverting signal may not be transmitted to the state maintaining means in a reliable manner. On the other hand, when the differential time constant is too large, the edge trigger means keeps outputting the inverting signal even after the rising/dropping direction of V0 (the oscillation output) inverted upon the state inversion of the state maintaining means, and V0 may exceedingly rise above V1 or drop below V2. Under these conditions, the state maintaining means can not control the oscillation output generating means normally, and the circuit can not operate in normal oscillation.

In contrast, according to the above arrangement, the edge trigger means detects the state inversion of the state maintaining means, whereupon the edge trigger means stops inputting the inverting signal into the state maintaining means to invert state thereof. Hence, the inverting signal is transmitted to the state maintaining means in a reliable manner, and V0 will not exceedingly rise above V1 or drop below V2. Consequently, the circuit can operate in normal oscillation in a reliable manner.

When the synchronous oscillation circuit is formed as an integral part of an IC, the resistor and capacitor of the differential circuit occupy a large area therein. However, since the circuit of the present embodiment can omit the resistor and capacitor, the edge trigger means occupies only a small area in the IC, thereby preventing an increase in manufacturing costs.

Embodiment 4

Figure 7:
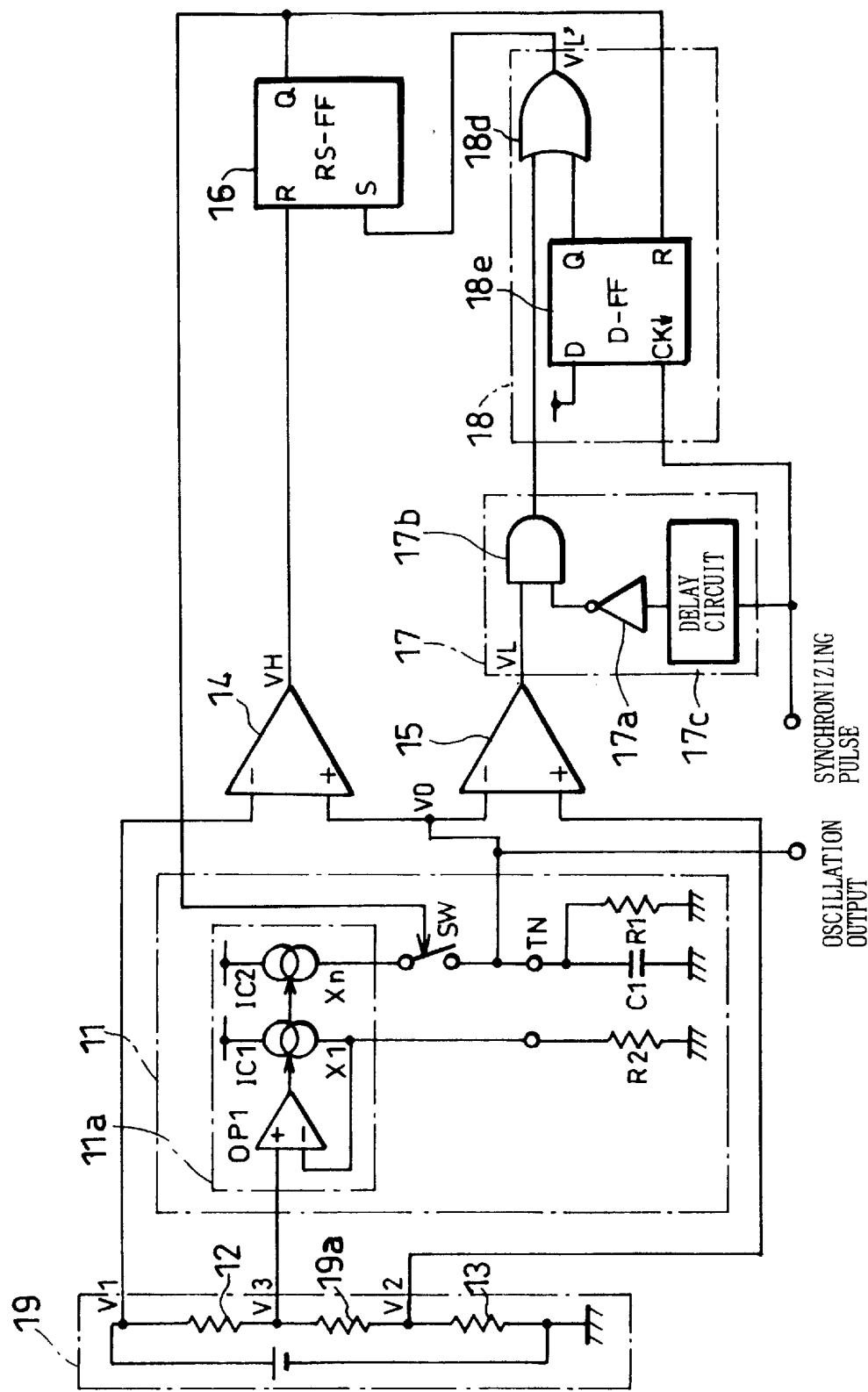
FIG. 7 is a circuit diagram depicting still another example circuitry arrangement of a synchronous oscillation circuit in accordance with the present invention.
Figure 8:
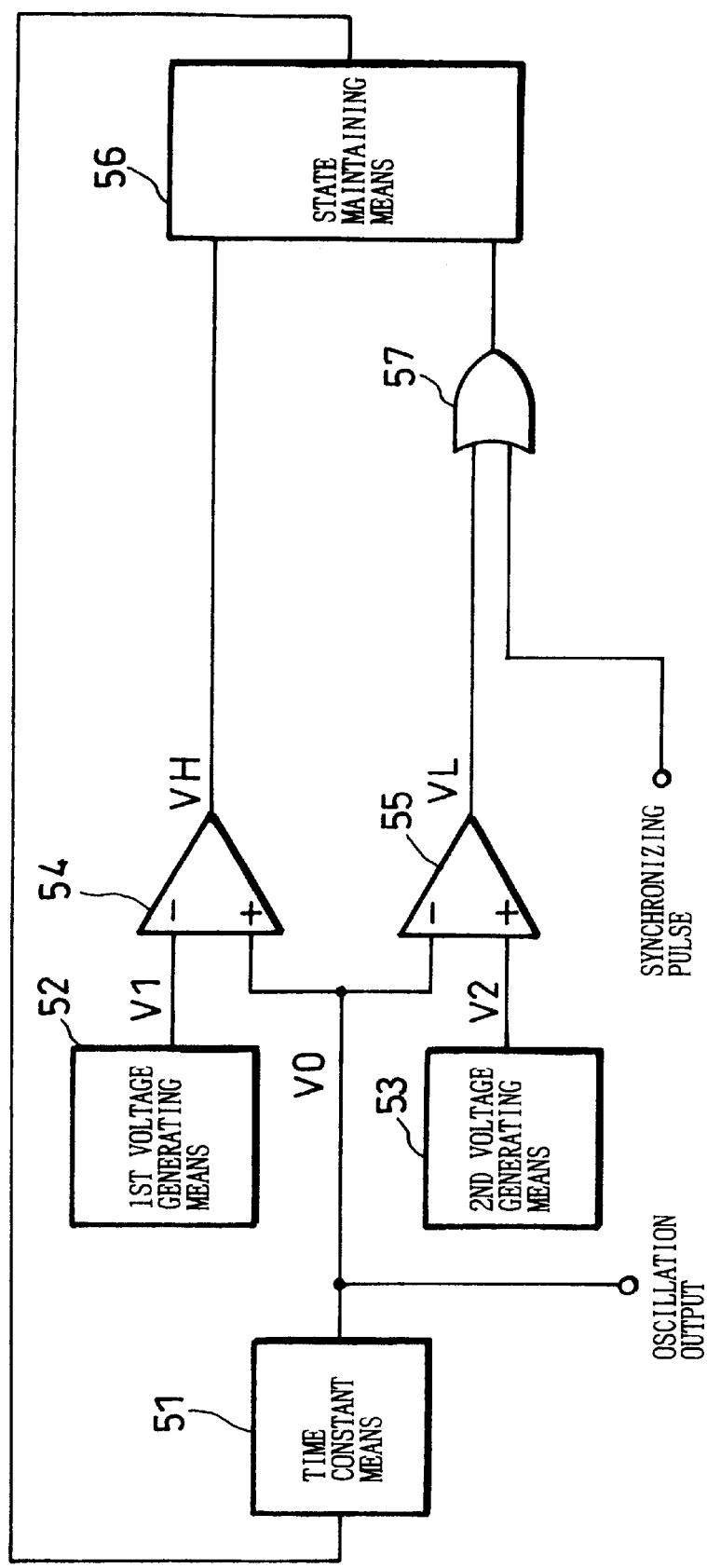
FIG. 8 is a block diagram depicting an example arrangement of a conventional synchronous oscillation circuit.

Referring to FIG. 7, the following description will describe still another example embodiment of the present invention. Hereinafter, like components are labeled with like reference numerals with respect to the above embodiments, and the description of these components is not repeated for ease of explanation.

FIG. 7 is still another example circuitry arrangement of a synchronous oscillation circuit of the present embodiment. As shown in FIG. 7, the present embodiment is different from Embodiment 3 in that a delay circuit 17c is additionally provided in the nullifying means 17, so that the synchronizing pulse is inputted into the inverter 17a through the delay circuit 17c. The delay circuit 17c keeps nullifying the output of the second comparing means 15 for as long as or longer than a delay time required when the edge trigger means 18 transmits the trigger pulse (VL') to the state maintaining means 16 even after the synchronizing pulse has become inactive. In short, the delay circuit 17c delays the cancellation of the nullification.

In Embodiments 1 through 3, in the event that the delay time of the nullifying means 17 is shorter than that of the edge trigger means 18, (1) if the cycle of the synchronizing pulse is shorter than that of the self-advancing oscillation, the state maintaining means 16 inverts the state when triggered by the trigger pulse from the edge trigger means 18, whereas (2) if the former is longer than the latter, the state maintaining means 16 inverts the state when triggered by a nullification cancelling signal from the nullifying means 17. Hence, two kinds of phase differences are generated between the synchronizing pulse and oscillation output. Therefore, if the cycle of the self-advancing oscillation and that of the synchronizing oscillation are approximated to each other to attain one of the objects of the present invention, these two kinds of phase differences between the synchronizing pulse and oscillation output appear at random when the self-advancing oscillation cycle and synchronizing oscillation cycle are too close. This may cause the oscillation cycle to fluctuate slightly.

In contrast, according to the arrangement of the present embodiment, by inserting the delay circuit 17c into the nullifying means 17 to produce a delay time longer than that of the edge trigger means 18, the state maintaining means 16 can be triggered by the output of the edge trigger means 18 in a reliable manner regardless of the large-and-small (long-and-short) relationship between the cycle of the self-advancing oscillation and that of the synchronous oscillation, thereby making it possible to eliminate the above problem.

In FIG. 7, the edge trigger means 18 is composed of a D flip-flop like in Embodiment 3. However, it should be appreciated that the edge trigger means 18 can be composed in the same manner as in Embodiment 1 or 2.

As has been discussed above, the synchronous oscillation circuit of the present embodiment is arranged in such a manner that the nullifying means has a delay time as long as or longer than a delay time of the edge trigger means.

According to the above arrangement, the delay time of the nullifying means is as long as or longer than the delay time of the edge trigger means. Hence, the nullifying means cancels the nullification after the delay time of the edge trigger means has passed since the synchronizing pulse became inactive. Consequently, the state maintaining means can invert its state at the timing specified by the edge trigger means in a reliable manner not only in a case where (a) the cycle of the synchronizing pulse is shorter than the cycle of the self-advancing oscillation, but also in a case where (b) the former is longer than the latter, in other words, regardless of the large-and-small relationship between the cycle of the self-advancing oscillation and that of the synchronizing pulse. Hence, the cycle of the oscillation does not fluctuate, thereby making stable synchronous oscillation possible.

The synchronous oscillation circuit of the present invention may be arranged in the following manner. That is, the synchronous oscillation circuit outputting a voltage V0 as an oscillation output and comprising:

a time constant means for raising or dropping V0 over time;

a first voltage generating means for generating a constant voltage V1;

a second voltage generating means for generating a constant voltage V2 which is lower than V1;

a first comparing means for comparing V0 with V1;

a second comparing means for comparing V0 with V2; and a state maintaining means for, when V0 rises above V1 upon receipt of an output VE of the first comparing means, dropping V0 and maintaining the dropping state through the time constant means, and when V0 drops below V2 upon input of an output VL of the second comparing means or upon input of the synchronizing pulse, raising V0 and maintaining the rising state through the time constant means, may further comprise:

a nullifying means for nullifying the output VL of the second comparing means while the synchronizing pulse is in the active state; and an edge trigger means for raising V0 and maintaining the rising state through the state maintaining means by detecting shifting of the synchronizing pulse from active to inactive.

Also, the above circuit may be arranged further in the following manner. That is, while the synchronizing pulse remains active, the nullifying means may nullify VH of the first comparing means instead of VL of the second comparing means, and that, upon detection of shifting of the synchronizing pulse from active to inactive, the edge trigger means drops V0 and maintains the dropping state through the state maintaining means.

In addition, the above circuit may be arranged further in the following manner. That is, the time constant means may include:

a first capacitor C1 and a first resistor R1 which are connected in parallel and grounded at their respective ends at one side;

a third voltage generating means for generating a voltage V3;

a second resistor R2;

a constant current generating means for generating a constant current proportional to a current flowing through the second resistor R2 when V3 of the third voltage generating means is applied to the second resistor R2; and an opening/closing means SW for allowing or inhibiting flowing of the constant current into the other end of the first capacitor C1 and first resistor R1, wherein the other end of the first capacitor C1 and first resistor R1 is an output end of V0 of the time constant means, which is raised or dropped by the opening/closing action of the opening/closing means SW.

The above circuit may be arranged further in the following manner. That is, V3 of the third voltage generating means which forms the edge trigger means may be an average of V1 and V2.

The above circuit may be arranged further in the following manner. That is, the edge trigger means may control the state maintaining means to invert its state in response to the shifting of the synchronizing pulse from active to inactive, and stops the control of the state maintaining means upon detection of such state inversion of the state maintaining means.

The above circuit may be arranged further in the following manner. That is, the nullifying means may cancel the nullification after a propagation delay time of the edge trigger means has passed since the synchronizing pulse became inactive.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A synchronous oscillation circuit comprising:

oscillation output generating means for generating a voltage as an oscillation output;

first comparing means for, upon detection that said voltage has become higher than a first constant voltage, shifting a first output signal therefrom to an active state from an inactive state;

second comparing means for, upon detection that said voltage has become lower than a second constant voltage, shifting a second output signal therefrom to an active state from an inactive state;

state maintaining means for, upon receipt of said first output signal shifted to the active state, outputting a dropping signal to said oscillation output generating means as a control signal which lowers said voltage over time, and upon receipt of said second output signal shifted to the active state, outputting a raising signal as the control signal to said oscillation output generating means which raises said voltage over time, said synchronous oscillation circuit operating in self-advancing oscillation in accordance with control of said state maintaining means over said oscillation output generating means when a synchronizing pulse for synchronous oscillation is not inputted, and when the synchronizing pulse is inputted, in the synchronous oscillation in sync with the synchronizing pulse;

nullifying means for, when the synchronizing pulse is in the active state, choosing one of said first comparing means and second comparing means as a nullification target and inhibiting transmission of an output from said nullification target to said state maintaining means, and when the synchronizing pulse is in the inactive state, allowing the transmission of the output from said nullification target to said state maintaining means; and edge trigger means for, when the synchronizing pulse has shifted from the active state to the inactive state, inputting an inverting signal to said state maintaining means, said inverting signal switching said control signal outputted from said state maintaining means between said dropping signal and raising signal.

2. The synchronous oscillation circuit of claim 1, wherein said oscillation output generating means includes:

a voltage source for generating said first and second constant voltages, and a third constant voltage which is equal to an average of said first and second constant voltages;

a second resistor;

a first constant current source for generating a first constant current which flows through said second resistor by applying said third constant voltage to said second resistor;

a second constant current source for generating a second constant current which is n times as large as said first constant current;

a first capacity and a first resistor which are connected in parallel and grounded at their respective ends at one side; and opening/closing means for raising/dropping a voltage at a non-grounded terminal of said first capacity and first resistor by switching an ON/OFF state of said second constant current with respect to said non-grounded terminal, wherein said voltage at said non-grounded terminal is outputted as said voltage as the oscillation output.

3. The synchronous oscillation circuit of claim 2, wherein said voltage source is composed of an integrated circuit.

4. The synchronous oscillation circuit of claim 1, wherein said state maintaining means is composed of an RS flip-flop.

5. The synchronous oscillation circuit of claim 1, wherein said nullifying means is composed of:

an inverter, into which the synchronizing pulse is inputted during the synchronous oscillation; and an AND gate, into which an output from said inverter and the output from said nullification target are inputted.

6. The synchronous oscillation circuit of claim 1, wherein said edge trigger means is composed of:

an inverter, into which the synchronizing pulse is inputted during the synchronous oscillation;

a differential circuit, into which an output from said inverter is inputted;

a NAND gate, into which the synchronizing pulse and an output from said differential circuit are inputted; and an OR gate, into which an output from said nullifying means and an output from said NAND gate are inputted.

7. The synchronous oscillation circuit of claim 1, wherein said edge trigger means stops inputting said inverting signal into said state maintaining means upon detection of switching of said control signal outputted from said state maintaining means.

8. The synchronous oscillation circuit of claim 7, wherein said edge trigger means is composed of a D flip-flop.

9. The synchronous oscillation circuit of claim 1, wherein said nullifying means includes a delay circuit for maintaining a nullified state of said nullification target for a period as long as or longer than a delay time of said edge trigger means.

* * * * *